US 12,107,594 B2

(12) United States Patent
Harris

(10) Patent No.: US 12,107,594 B2
(45) Date of Patent: Oct. 1, 2024

(54) DIFFERENTIAL TO SINGLE ENDED PIPELINE ANALOG TO DIGITAL CONVERTER

(71) Applicant: Dunmore Circuits, LLC, Austin, TX (US)

(72) Inventor: Larry L. Harris, Austin, TX (US)

(73) Assignee: Dunmore Circuits, LLC, Austin, TX (US)

( * ) Notice: Subject to any disclaimer, the term of this patent is extended or adjusted under 35 U.S.C. 154(b) by 142 days.

(21) Appl. No.: 17/959,976

(22) Filed: Oct. 4, 2022

(65) Prior Publication Data

US 2023/0344438 A1 Oct. 26, 2023

Related U.S. Application Data

(63) Continuation-in-part of application No. 17/889,002, filed on Aug. 16, 2022.

(60) Provisional application No. 63/334,251, filed on Apr. 25, 2022.

(51) Int. Cl.
*H03M 1/00* (2006.01)
*H03M 1/12* (2006.01)
*H03M 1/18* (2006.01)
*H03M 1/54* (2006.01)

(52) U.S. Cl.
CPC ......... *H03M 1/1245* (2013.01); *H03M 1/183* (2013.01); *H03M 1/54* (2013.01)

(58) Field of Classification Search
CPC ....... H03M 1/1245; H03M 1/183; H03M 1/54
USPC ................... 341/155, 144, 161, 122
See application file for complete search history.

(56) References Cited

U.S. PATENT DOCUMENTS

| | | | |
|---|---|---|---|
| 3,329,950 A | 7/1967 | Shafer | |
| 5,043,732 A | 8/1991 | Robertson | |
| 5,274,377 A | 12/1993 | Matsuura | |
| 5,499,027 A | 3/1996 | Karanicolas | |
| 6,028,546 A * | 2/2000 | Signell | H03M 1/0687 341/161 |
| 6,956,519 B1 | 10/2005 | Huang | |
| 7,852,252 B2 | 12/2010 | Ge | |
| 8,362,939 B2 | 1/2013 | Buter | |
| 8,698,658 B1 | 4/2014 | Ghatak | |
| 11,218,158 B1 * | 1/2022 | Patil | H03M 1/1071 |
| 11,569,837 B1 * | 1/2023 | Akhavan | H03F 3/45659 |
| 2009/0102688 A1 * | 4/2009 | Cesura | H03M 1/1004 341/110 |
| 2010/0295714 A1 * | 11/2010 | Johancsik | H03M 1/168 341/110 |
| 2013/0187802 A1 | 7/2013 | De Figueiredo | |

* cited by examiner

*Primary Examiner* — Peguy Jean Pierre
(74) *Attorney, Agent, or Firm* — Garlick & Markison; Timothy D. Taylor

(57) ABSTRACT

A pipeline analog to digital converter includes a "k" number of stages and an output data register. A first stage of the "k" number of stages is configured to receive an analog differential input signal and produce a first digital output and a first single ended analog output. A second stage of the "k" number of stages is configured to receive the first single ended analog output and produce a second digital output. The output data register is configured to generate an output digital value based on the first and second digital outputs.

20 Claims, 13 Drawing Sheets

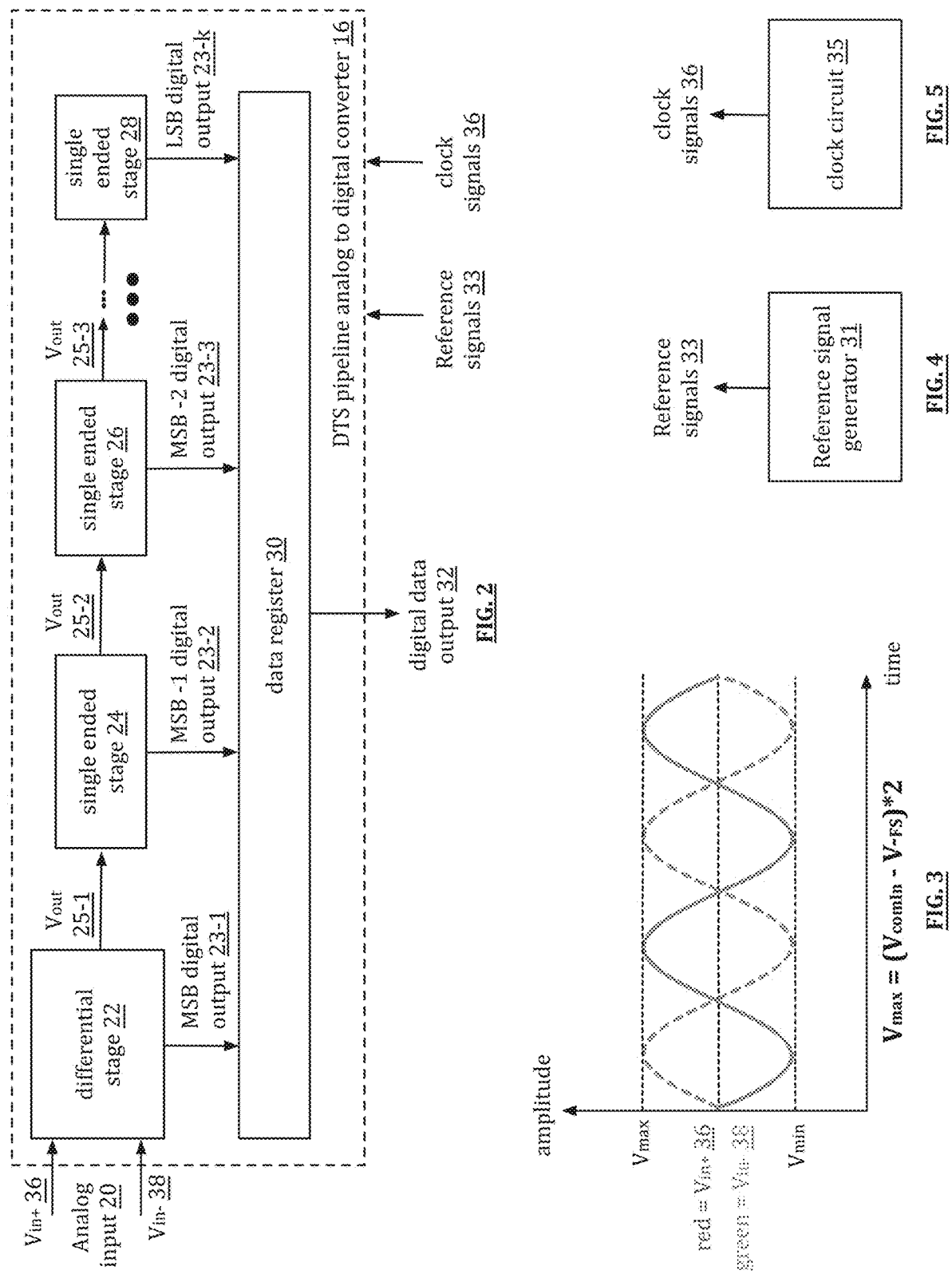

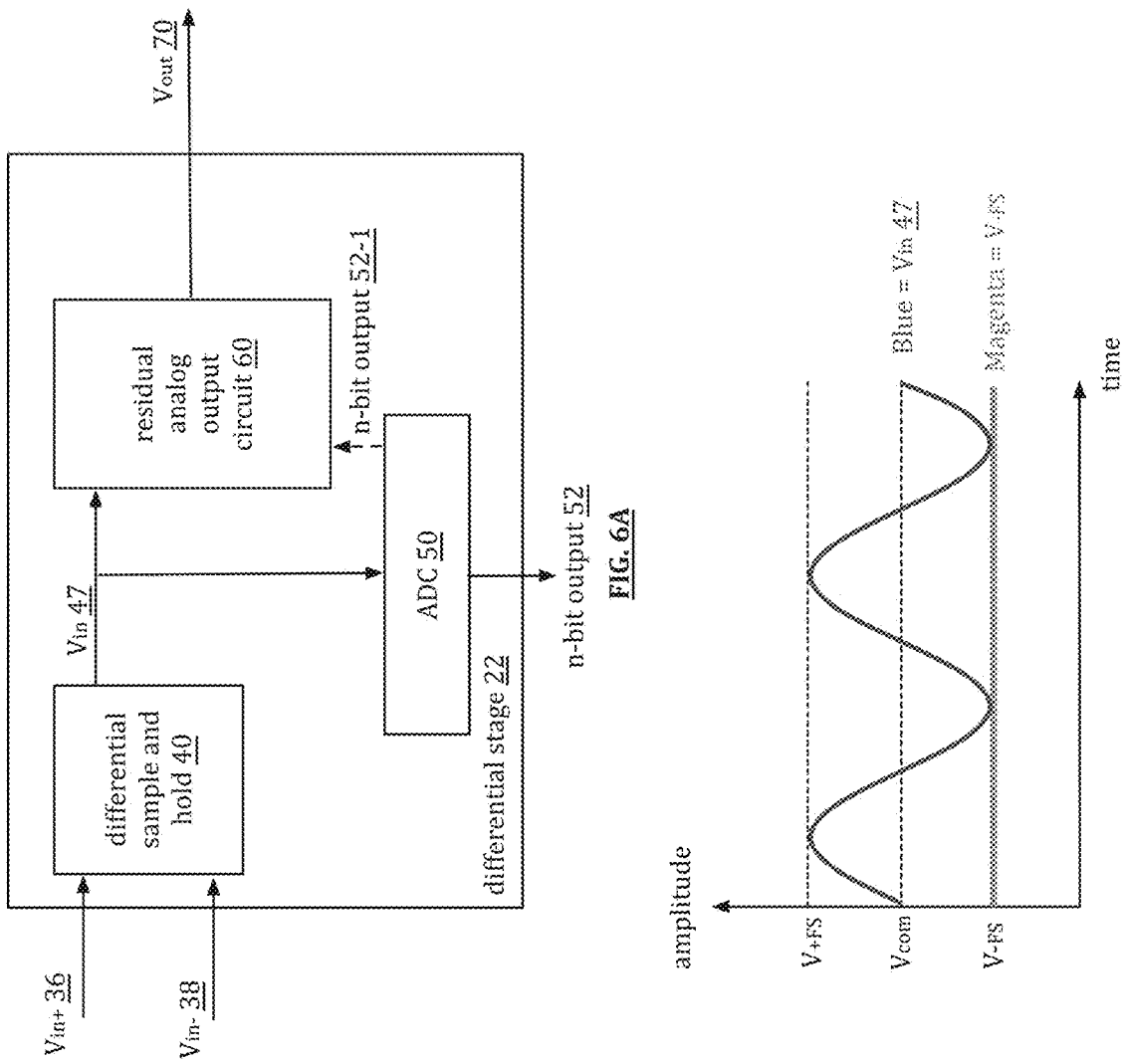

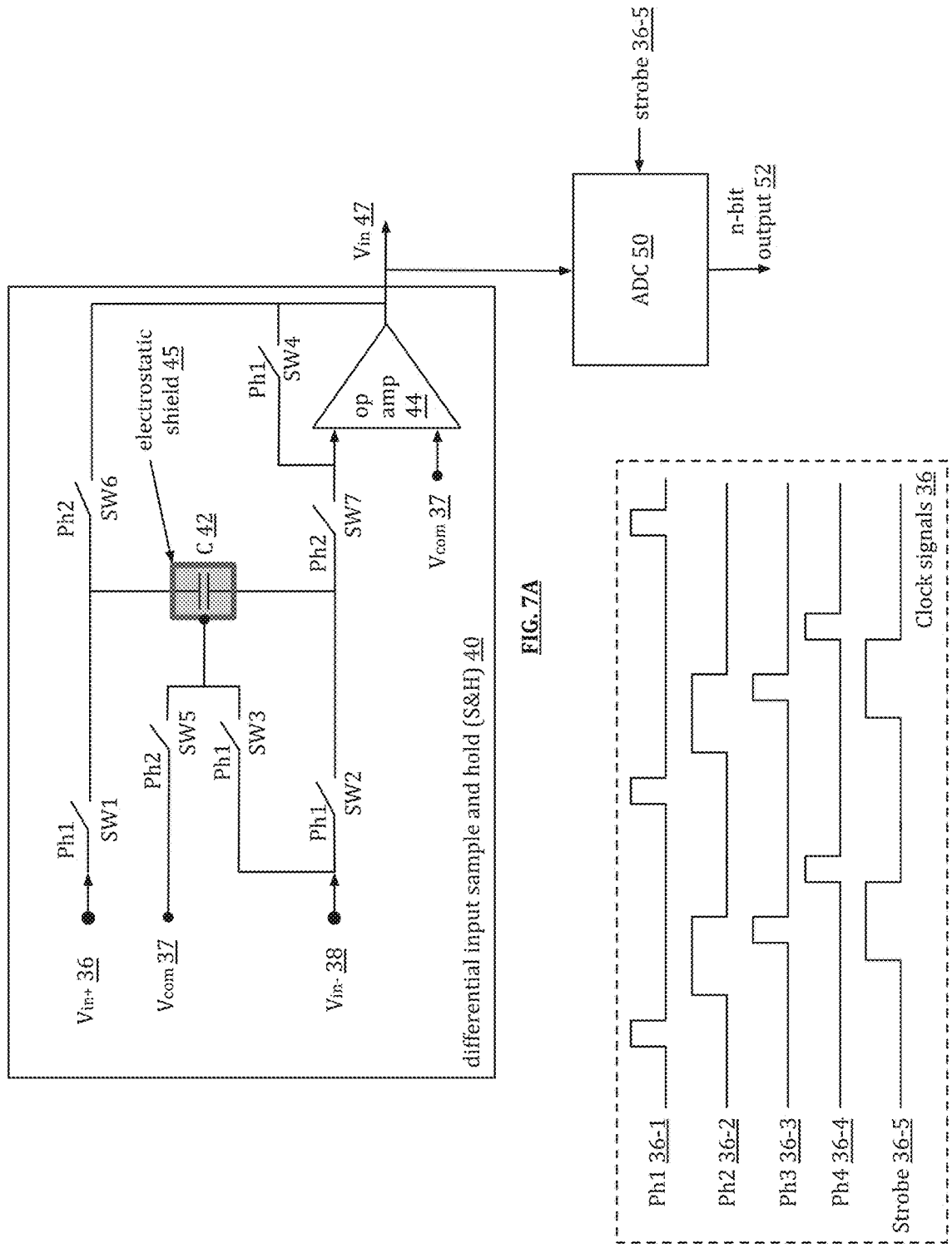

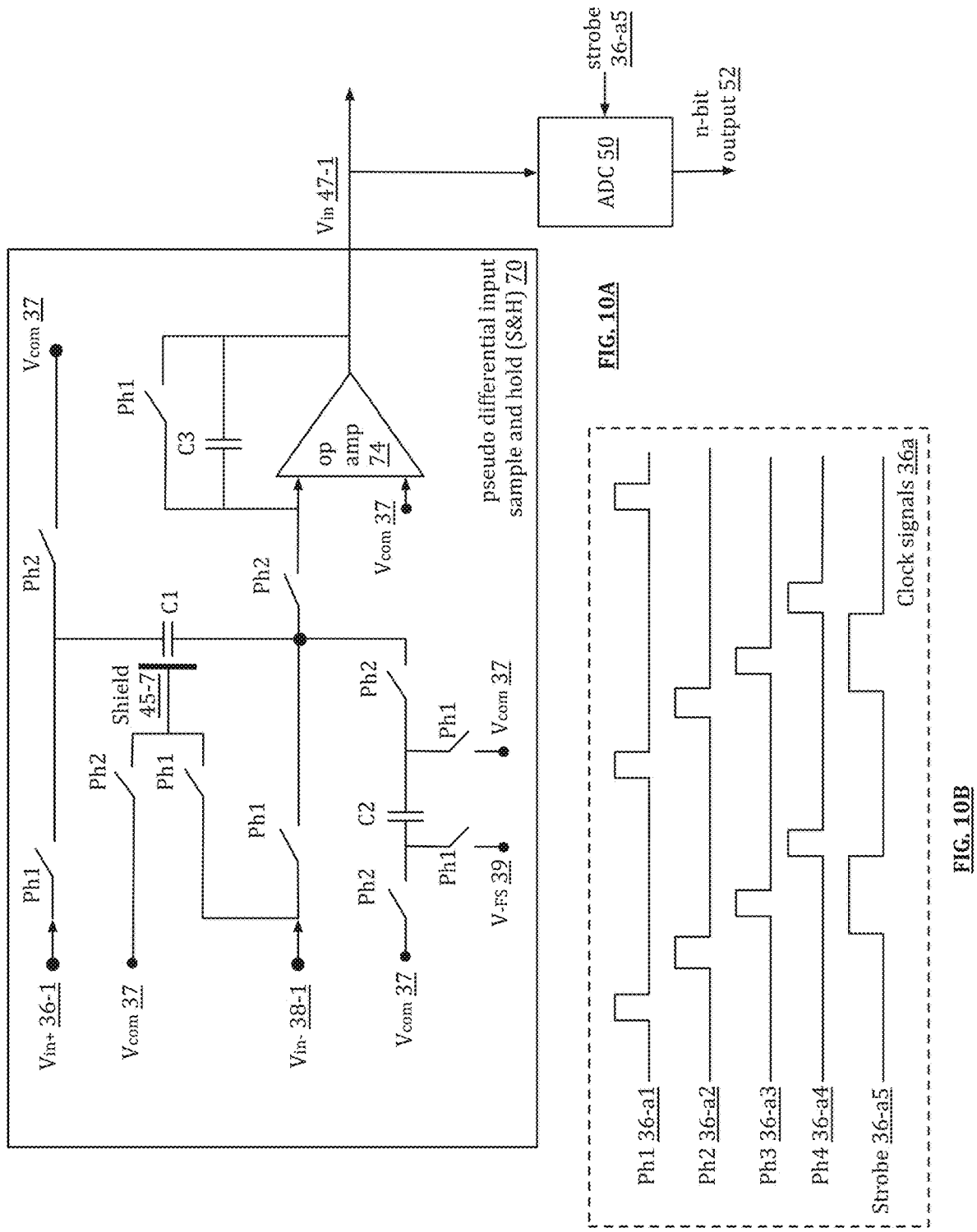

DIFFERENTIAL TO SINGLE ENDED PIPELINE ANALOG TO DIGITAL CONVERTER

CROSS-REFERENCE TO RELATED APPLICATIONS

The present U.S. Utility patent application claims priority pursuant to 35 U.S.C. § 120 as a continuation-in-part of U.S. Utility application Ser. No. 17/889,002, entitled "DIFFERENTIAL CHARGE SAMPLING CIRCUIT WITH INTEGRATED FARADAY SHIELD," filed Aug. 16, 2022, which claims priority pursuant to 35 U.S.C. § 119(e) to U.S. Provisional Application No. 63/334,251, entitled "DIFFERENTIAL CHARGE SAMPLING CIRCUIT WITH INTEGRATED FARADAY SHIELD," filed Apr. 25, 2022, all of which are hereby incorporated herein by reference in their entirety and made part of the present U.S. Utility patent application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to analog and digital circuits and more particularly to pipeline analog to digital circuits.

Description of Related Art

Circuits are used in a wide variety of applications, from smart home devices, to industrial systems, to communication devices, to transportation, and so on. For example, circuits are used in cell phones, computers, manufacturing robotics, boats, trucks, televisions, appliances, touchscreens, medical imaging, base stations, cable modems, etc. for a variety of applications.

Some common circuits include an analog to digital converter circuit, a comparator circuit, a voltage regulator circuit, a digital to analog converter circuit, a summing circuit, a current source circuit, an operational amplifier circuit, and a voltage divider circuit. The analog to digital circuits (ADCs) are a type of circuit that receive an analog signal as an input and produce a digital output. Common types of ADCs include flash ADCs, sigma-delta ADCs, ramp ADCs, and pipeline ADCs.

These circuits may provide signals to one or more computing devices for processing. A computing device is known to communicate data, process data, and/or store data. The computing device may be a cellular phone, a laptop, a tablet, a personal computer (PC), a work station, a video game device, a server, and/or a data center that support millions of web searches, stock trades, or on-line purchases every hour.

Another type of circuit is an integrated circuit. Integrated circuits may include a thin film layer of components that include transistors, diodes, resistors, and capacitors with interconnecting conductive wires, formed onto the surface of a substrate. Integrated circuits are used in applications that include analog, digital, and mixed, which can perform digital to analog and analog to digital conversions.

BRIEF DESCRIPTION OF THE SEVERAL VIEWS OF THE DRAWING(S)

FIG. 2 is a schematic block diagram of an embodiment of differential to single (DTS) pipeline analog to digital converter (ADC);

FIG. 3 is a graph illustrating of an embodiment of a differential analog input voltage signal;

FIG. 4 is a schematic block diagram of an embodiment of reference signal generator;

FIG. 5 is a schematic block diagram of an embodiment of a clock circuit;

FIG. 6A is a schematic block diagram of an embodiment of a first stage of the DTS pipeline ADC;

FIG. 6B is a graph of an embodiment of a voltage signal output from a differential sample and hold circuit;

FIG. 7A is a schematic block diagram of an embodiment of a differential input sample and hold (S&H) circuit;

FIG. 7B is a graph illustrating an embodiment of clock signals for a differential stage;

FIG. 10A is a schematic block diagram of an embodiment of a pseudo differential input sample and hold (S&H) circuit;

FIG. 10B is a graph illustrating an embodiment of clock signals for the pseudo differential input sample and hold (S&H) circuit;

DETAILED DESCRIPTION OF THE INVENTION

Figure 1:
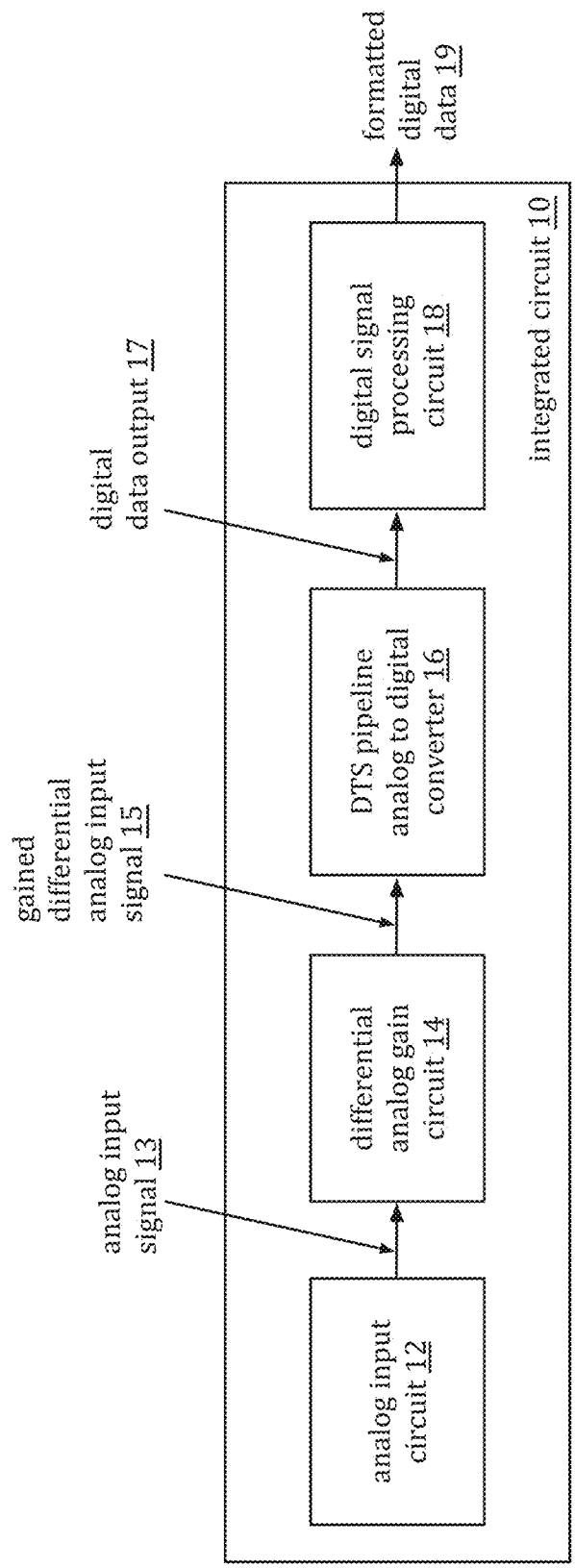
FIG. 1 is a schematic block diagram of an embodiment of integrated circuit.

FIG. 1 is a schematic block diagram of an embodiment of an integrated circuit 10 that includes an analog input circuit 12, a differential analog gain circuit 14, a differential to single ended (DTS) pipeline analog to digital converter (ADC) circuit 16, and a digital signal processing circuit 18.

In general, the integrated circuit 10 operates to produce formatted digital data 19 based on an analog input signal 13. In an example, the analog input circuit 12 is an antenna operable to receive one or more radio frequencies. As another example, the analog input circuit is a microphone operable to receive one or more sound waves.

The DTS pipeline ADC circuit 16 includes a plurality of stages. A first stage of the plurality of stages receives a differential input analog signal and outputs a single ended analog signal. A second stage of the plurality of stages receives the single ended analog signal, and when there is a third stage, outputs a second single ended analog signal. The first stage being a differential input stage increases the SNR (e.g., by rejecting common mode noise, reducing ground loops, etc.) of the DTS pipeline ADC 16. The second stage being a single ended input stage lowers the power input of the DTS pipeline ADC 16 and saves space of the DTS pipeline ADC 16 (e.g., by reducing number of needed components), among other advantages.

In an example of operation, the analog input circuit 12 (produces an analog signal 13 based on receiving or detecting a stimulus (e.g., radio frequency signal, voice, etc.). The differential analog gain circuit 14 generates a gained differential analog input signal 15 based on the analog input signal. For example, the differential analog gain circuit modifies (increases, decreases) the amplitude of the analog input circuit to produce the gained differential analog input signal 15 such the magnitude of the signal 15 is between a supply voltage (Vdd) of the DTS pipeline ADC 16 and a ground voltage (Gnd) of the DTS pipeline ADC 16. As another example, the differential analog gain circuit inverts the analog signal 13 to produce an inverted analog input signal that is 180° out of phase as the analog signal 13.

The DTS pipeline ADC 16 generates a digital data output 17 based on the gained differential analog input signal 15. In an example, the digital data output 17 is a word that is k-bits long, where "k" is a number of stages of the DTS pipeline ADC 16 (e.g., when each stages outputs one bit). The digital signal processing circuit 18 generates formatted digital data 19 based on the digital data output 17. For example, the digital signal processing circuit 18 filters and formats the digital data output 17 to produce formatted digital data 19. In an example, the formatted digital data 19 is sent to one or more computing devices for further processing and/or storage.

FIG. 2 is a schematic block diagram of an embodiment of a differential to single ended (DTS) pipeline analog to digital converter (ADC) 16. As illustrated, the DTS pipeline ADC 16 includes a differential stage 22, a single ended stage 24, a single ended stage 26, and so on up to a single ended stage 28, and a data register 30. Note that a "k" number of stages may be more or less than shown, where the number "k" is an integer equal to or greater than 2. The DTS pipeline ADC 16 also obtains (e.g., receives, generates) reference signals 33 and clock signals 36.

In an example of operation, the differential stage 22 receives an analog differential input signal 20 that includes a $V_{in+}$ 36 component and a $V_{in-}$ 38 component. The $V_{in+}$ and $V_{in-}$ components 36 and 38 are one hundred and eighty degrees (180°) out of phase (e.g., inverse of the other). The differential stage 22 produces a first digital output, which is a most significant bit (MSB) digital output 23-1. The differential stage 22 also produces a first single ended analog output, $V_{out}$ 25-1. The second stage, single ended stage 24, receives $V_{out}$ 25-1 and produces a second digital output 23-2 and a second single ended analog output $V_{out}$ 25-2 based on sampling $V_{out}$ 25-1. Note that when the second stage is the "kth" or final stage, the second stage does not need to generate $V_{out}$ 25-2.

The third stage (e.g., single ended stage 26) receives the single ended analog output of the previous stage (e.g., $V_{out}$ 25-2) and produces a third digital output 23-3 and a third analog output 25-3, and so on up to a "kth" single ended stage 28, which receives the single ended analog output of the previous stage (e.g., $V_{out}$ 25-$k$-1) and produces a kth digital output 23-$k$, which is a least significant bit (LSB) digital output. Data register 30 receives the digital outputs from each of the k stages and produces a digital data output 32. For example, the data register combines the digital output bits 23-1 through 23-$k$ into an n*k-bit digital data word as the digital data output 32, where n is the bits per stage and k is the number of stages.

In an example, the data register 30 aligns the bits (e.g., in accordance with clock signals 36) such that after an initial latency (e.g., k cycles), each next cycle produces a new n*k-bit wide data word. In a specific example, each digital data output 32 is a combination of one bit from the most significant bit (MSB) to the least significant bit (LSB) from each of the k stages for a total of k bits.

FIG. 3 is a graph illustrating an embodiment of a differential input voltage signal (e.g., analog input 20). The red dashed analog signal illustrates the $V_{in+}$ 36 signal of FIG. 2 and the green solid analog signal illustrates the $V_{in-}$ 38 signal of FIG. 2. As shown, signals $V_{in+}$ 36 and $V_{in-}$ 38 are one hundred and eighty degrees out of phase. The maximum voltage ($V_{max}$) for the analog input 20 is based on the equation:

$V_{max} = (V_{comIn} - V_{-FS}) * 2$; where $V_{comIn}$ is the input signal common voltage defined as: $V_{comIn} = ((V_{in+}) + (V_{in-}))/2$; where $V_{-FS}$ is a negative full scale voltage of the DTS pipeline ADC 16. Note that $V_{comIn}$ can be a value between $V_{dd}$ and ground of the DTS pipeline ADC 16, as long as input signals $V_{in+}$ 36 and $V_{in-}$ 38 do not exceed $V_{dd}$ and ground. Further, the peak voltage amplitude of the differential input signal is $2*V_{max}$.

FIG. 4 is a schematic block diagram of an embodiment of reference signal generator 31. The reference signal generator is configured to generate reference signals 33, which are direct current (DC) voltage reference signals for the DTS pipeline ADC 16. For example, the reference signal generator 31 generates a negative full scale voltage ($V_{-FS}$) signal. As another example, the reference signal generator 31 generates a common voltage ($V_{com}$) signal, which is a common-mode voltage of operational amplifiers of the DTS pipeline ADC 16. In an embodiment, the reference signal generator 31 does not generate a positive full scale voltage ($V_{+FS}$) signal based on how switched capacitors of the DTS pipeline ADC 16 sample the $V_{com}$ and $V_{-FS}$ voltages. For example, an effective positive full scale voltage ($V_{+FS}$) is achieved based on the equation: $V_{+FS} = (2*(V_{com} - V_{-FS})) + V_{-FS}$. The switched capacitors are discussed in further detail with reference to one or more subsequent Figures.

One improvement of not having to produce the $V_{+FS}$ reference signal is reduced circuitry with a low output impedance for quick charging the switched capacitor circuits. Another improvement is eliminating a source of distortion in the analog to digital conversion (e.g., when $V_{com}$ is not exactly between $V_{+FS}$ and $V_{-FS}$).

FIG. 5 is a schematic block diagram of an embodiment of a clock circuit 35. Clock circuit 35 generates clock signals 36 for the DTS pipeline ADC 16. The clock signals 36 include one or more of a phase clock, a strobe clock, a set clock, a reset clock, a clear clock, and a flip flop clock. The clock signals 36 are used by the DTS pipeline ADC 16 to synchronize the digital outputs from each stage to accurately produce digital data output 32 based on the analog input 20. The clocks signals 36 will be discussed in further detail with reference to one or more of FIGS. 6A-16.

FIG. 6A is a schematic block diagram of an embodiment of a differential stage 22 (e.g., the first stage) of the DTS pipeline ADC 16. The differential stage 22 includes a differential sample and hold (S&H) circuit 40, an analog to digital converter (ADC) 50, and a residual analog output circuit 60. The differential sample and hold circuit 40 generates a single ended voltage signal $V_{in}$ 47, which is shown in FIG. 6B having a maximum amplitude of a positive full scale voltage ($V_{+FS}$) and a minimum amplitude of a negative full scale voltage ($V_{-FS}$).

The analog to digital converter (ADC) 50 generates an n-bit output 52 based on $V_{in}$ 47. For example, when "n" is 1, and when $V_{in}$ 47 is above a first threshold voltage level (e.g., $V_{com}$), the output 52 represents a digital 1, and when $V_{in}$ 47 is below the first threshold voltage level, the output 52 represents a digital 0. The n-bit digital output 52 is output to the data register 30 (e.g., as MSB 23-1). The ADC 50 feeds back the n-bit output 52-1 to a feedback digital to analog converter (DAC) of the residual analog output circuit 60. The residual analog output circuit 60 produces a voltage output signal $V_{out}$ 70 based on one or more of $V_{in}$ 47 and the fed back representation of the n-bit output 52-1.

With the first stage 22 having a differential input, the DTS pipeline ADC 16 is able to effectively reject common mode input noise and substantially reduce occurrences of ground loops between the signal source and the DTS pipeline ADC 16. Further, by producing a single ended voltage signal from the differential sample and hold circuit 40, subsequent circuits and stages of the DTS pipeline ADC are single ended circuits, which decreases the number of components required for the DTS pipeline ADC, decreases the size of the DTS pipeline ADC, and decreases the power requirements of the DTS pipeline ADC, among other advantages.

FIG. 7A is a schematic block diagram of an embodiment of a differential input sample and hold (S&H) circuit 40 coupled to an analog to digital circuit (ADC) 50. In this example, the differential input S&H 40 is part of a differential stage 22 of the DTS pipeline ADC 16 that receives a differential input signal, while remaining circuits and/or stages receive a single ended signal. The differential input sample and hold circuit 40 includes a plurality of switches (SW1-7), an electrostatic shield 45 proximal to a switched capacitor (C) 42, differential inputs $V_{in+}$ 36 and $V_{in-}$ 38, a common voltage ($V_{com}$) input 37, and an operation amplifier (op amp) 44.

As used herein, proximal indicates one or more of substantially surrounded, covered, shielded, and being placed within a distance and/or at an orientation to prevent certain noise from affecting (e.g., coupling to) a capacitor. In an example, the electrostatic shield 45 is a faraday cage. In another example, the electrostatic shield 45 is a trace formed from substantially the same material as the layer of an integrated circuit.

In an example, a switch of the plurality of switches is implemented by one or more of a transistor (e.g., Bipolar Junction Transistor (BJT), Metal Oxide Semiconductor Field Effect Transistor (MOSFET), etc.), a power diode, a silicon controlled rectifier, and a thyristor.

In an example of operation, the capacitor (C) 42 samples the analog differential input signal ($V_{in+}$ 36 and $V_{in-}$ 38) during a first time period. For example, the first time period occurs while the phase 1 (ph1) clock signal 36-1 of FIG. 7B is high. When ph1 is high, switches 1, 2, 3, and 4 close. As such, the capacitor 42 is connected to $V_{in-}$ 38 and $V_{in+}$ 36, the electrostatic shield 45 that is proximal to capacitor 42 is coupled to $V_{in-}$, and the feedback loop of the operational amplifier 44 is closed.

When the phase 1 clock signal 36 goes low, switches 1-4 open and the charge on capacitor 42 is held until a second time period, when phase 2 (ph2) clock signal 36-2 of FIG. 7B goes high, and switches 5, 6, and 7 close. During the second time period, the operational amplifier 44 generates analog input voltage signal ($V_{in}$) 47 based on a comparison of the sampled signal (e.g., a voltage based on a charge held on C42) and a common voltage ($V_{com}$) 37. For example, the output voltage $V_{in}$ 47 is equal to the equation: $V_{in\ 47} = (V_{in+}) - (V_{in-}) + (V_{com})$. Further during the second time period, the electrostatic shield 45 is connected via switch SW5 to voltage source $V_{com}$ 37.

In an example, the electric fields from signals that are not a part of the input signals $V_{in+}$ 36 and $V_{in-}$ 38 can capacitively couple onto the capacitor 42, which can cause signal errors in the input sampled charge. These unwanted signals (e.g., signals other than input signals from terminals $V_{in+}$ 36 and $V_{in-}$ 38) can be electrically modeled as parasitic capacitors connected from the unwanted signal into the terminals of the capacitor 42. By placing the electrostatic shield proximal (e.g., surrounded, enclosed, etc.) to the capacitor 42, the unwanted signals couple onto the electrostatic shield 45 and not the sampling capacitor 42. The switching of the electrostatic shield from $V_{in-}$ to $V_{com}$ minimizes any of the parasitic capacitances from effecting the sampled signal. As a result of the switching the electrostatic shield 45, the sampled charge is able to be transferred with substantially no loss of signal quality or dynamic range of the sampled signal. The parasitic capacitances and switching the electrostatic shield are discussed in further detail with reference to one or more subsequent Figures, including FIG. 8A. In an example, the voltage sources of FIG. 7A are low impedance sources (e.g., 1000 ohms or less).

Continuing with the example during the second time period, the ADC 50 is strobed via strobe signal 36-5, and the ADC 50 outputs an n-bit output 52, which is a digital value representing the sampled differential signal $V_{in+}$ 36 and $V_{in-}$ 38. For example, the digital value is a binary "1" when the sampled differential signal is greater than $V_{com}$ 37, and is a binary "0" when the sampled differential signal is less than or equal to $V_{com}$ 37.

FIG. 7B is a graph illustrating clock signals 36-1 through 36-5 for a differential stage of the DTS pipeline ADC 16. As illustrated, phase 1 36-1 and phase 2 36-2 signals are non-overlapping, while the phase 2 36-2 and phase 3 36-3 signals are overlapping and have their respective falling edges aligned. The differential stage utilizes the clock signals 36 such that the analog input signal is able to be sampled, converted to a digital representation, and transferred to a next stage. The clock signals 36 are discussed in further detail with reference to one or more subsequent Figures.

Figure 8A:
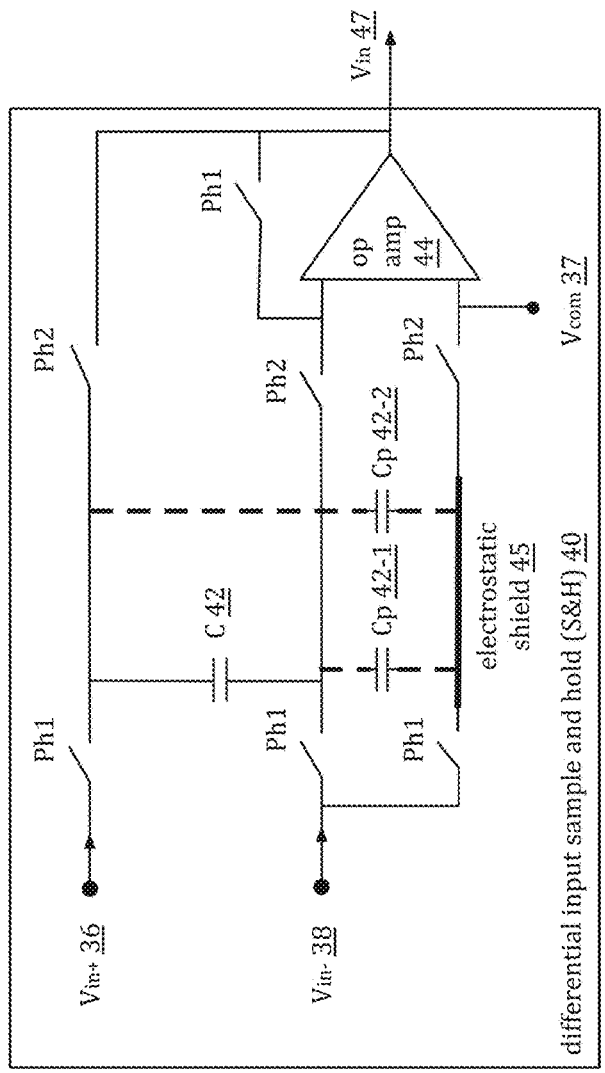
FIG. 8A is a schematic block diagram of an embodiment of a differential sample and hold (S&H) circuit.

FIG. 8A is a schematic block diagram of an embodiment of a differential sample and hold (S&H) circuit 40 having an electrostatic shield 45. As shown, the electrostatic shield 45 has parasitic capacitances 42-1 and 42-2, which are a result from unwanted signals (e.g., signals other than $V_{in+}$ 36 and $V_{in-}$ 38) capacitively coupling to the electrostatic shield 45. During sampling and transferring the differential analog input signal ($V_{in+}$ 36 and $V_{in-}$ 38) by the capacitor C 42, the electrostatic shield 45 is switched between $V_{in-}$ 38 and $V_{com}$ 37 to minimize the effects that the parasitic capacitances 42-1 and 42-2 could have on the sampled signal. For example, during the first time period (e.g., when ph1 switches are closed), parasitic capacitance 42-1 is shorted at $V_{in-}$ 38. Thus, during the first time period, no charge is on parasitic capacitance 42-1 (e.g., the voltage is substantially zero volts). For example, the unwanted signal is shunted via low impedance $V_{in-}$ 38. During the second time period (e.g., when ph2 switches are closed and ph1 switches are open), the voltage is zero across Cp 42-1 as the inputs to the op amp 44 are substantially the same voltage. Thus, no charge couples to the sampled input signal from the electrostatic shield via parasitic capacitor Cp 42-1.

As another example, during the first time period, parasitic capacitance 42-2 has a charge based on a capacitance and the voltage across Cp 42-2 being equal to $(V_{in+})-(V_{in-})$, which is substantially the same voltage as capacitor 42. During the second time period, the charge on Cp 42-2 stays constant as the voltage across Cp 42-2 is substantially the same as the voltage across capacitor 42. Thus, the unwanted charge on Cp 42-2 does not affect the charge sampled on capacitor 42 (e.g., the unwanted charge does not couple to the sampled charge), which allows the differential input sample and hold circuit 40 to sample and transfer the differential analog input signal with substantially no loss in signal quality or dynamic range.

Figure 8C:
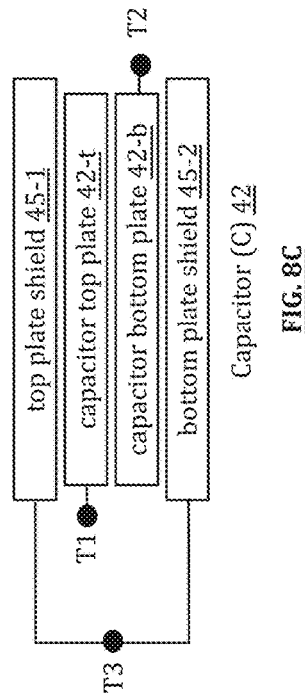
FIG. 8C is a schematic block diagram of an embodiment of a shielded capacitor.
Figure 8B:
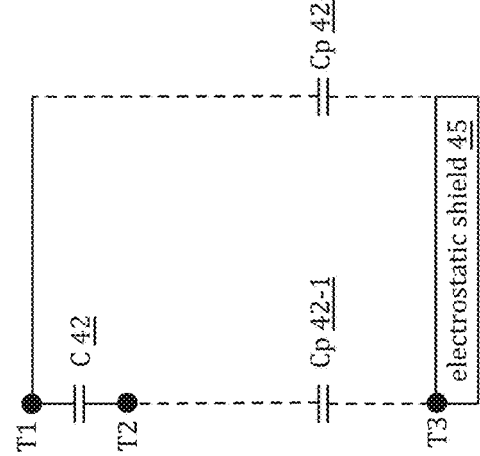
FIG. 8B is a schematic block diagram of an embodiment of a capacitor and an electrostatic shield.

FIG. 8B is a schematic block diagram of an embodiment of an example of the capacitor 42 and electrostatic shield 45 of FIG. 8A. As shown, a first terminal is located above capacitor 42, a second terminal is located below the capacitor 42, and a third terminal is connected to electrostatic shield 45. In an example, with no electrostatic shielding, unwanted signals present near the capacitor 42, may capacitively couple onto the capacitor 42. As such, an electrostatic shield 45 is placed proximal to the capacitor 42 such that the unwanted signals will couple to the electrostatic shield and not the capacitor 42. The coupling of the unwanted signals can be electrically modeled as a parasitic capacitance 42-1 and/or 42-2. For example, a first parasitic capacitance Cp 42-1 can be electrically modeled from the first terminal to the electrostatic shield 45 and a second parasitic capacitance Cp 42-2 can be electrically modeled from the second terminal to the electrostatic shield 45.

Further, the voltage on terminal 3 connected to the electrostatic shield 45 can be switched to substantially match the voltage on terminal 1 or 2 of the capacitor 42, a reference voltage ($V_{com}$, ground, etc.), and/or another voltage to control the charge of the parasitic capacitances such that the parasitic capacitances Cp 42-1 and Cp 42-2 do not substantially affect the charge on the capacitor 42.

FIG. 8C is a schematic block diagram of an embodiment of the capacitor 42 of FIG. 8B that includes an electrostatic shield 45. In this embodiment, the electrostatic shield 45 includes a top plate shield 45-1 proximal to (e.g., above, encloses, surrounds, etc.) a capacitor top plate 42-t and a bottom plate shield 45-2 proximal to a capacitor bottom plate 42-b. In an example, the combination of the top place shield and the bottom place shield substantially encapsulates the capacitor 42. In another example, the bottom place shield 45-2 and the top place shield 45-1 are coupled together as a single shield and/or include side plate shields (not shown).

Figure 9A:
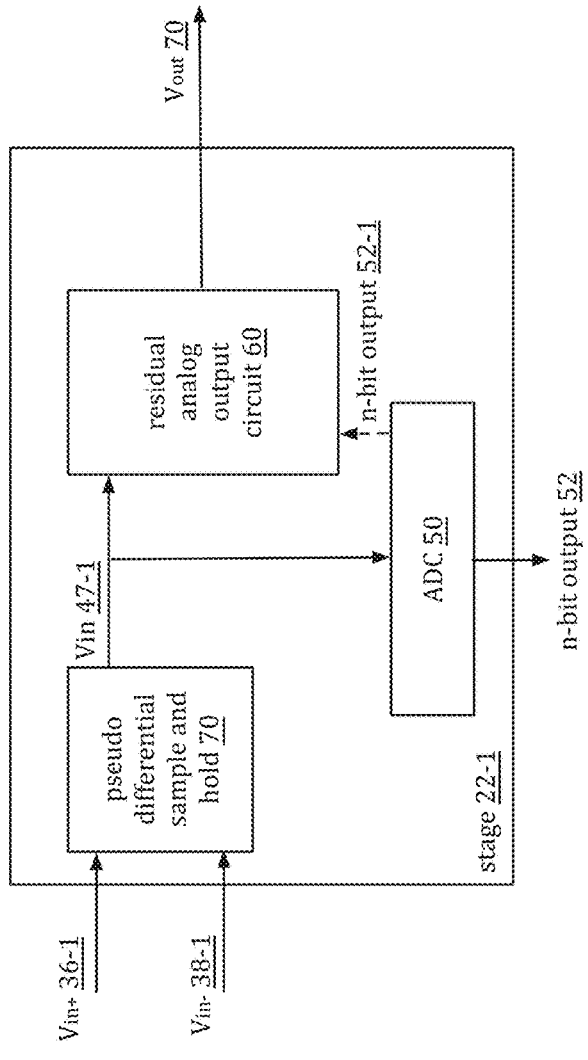
FIG. 9A is a schematic block diagram of another embodiment of a first stage of the pipeline ADC.

FIG. 9A is a schematic block diagram of another embodiment a first stage 22-1 of the DTS pipeline analog to digital converter (ADC) 16 of FIG. 2. This embodiment is similar to FIG. 6A, with a difference being the differential sample and hold (S&H) circuit 40 is replaced by a pseudo differential S&H circuit 70. The operation of the pseudo differential S&H circuit 70 is discussed in further detail with reference to FIGS. 9B-10B.

Figure 9B:
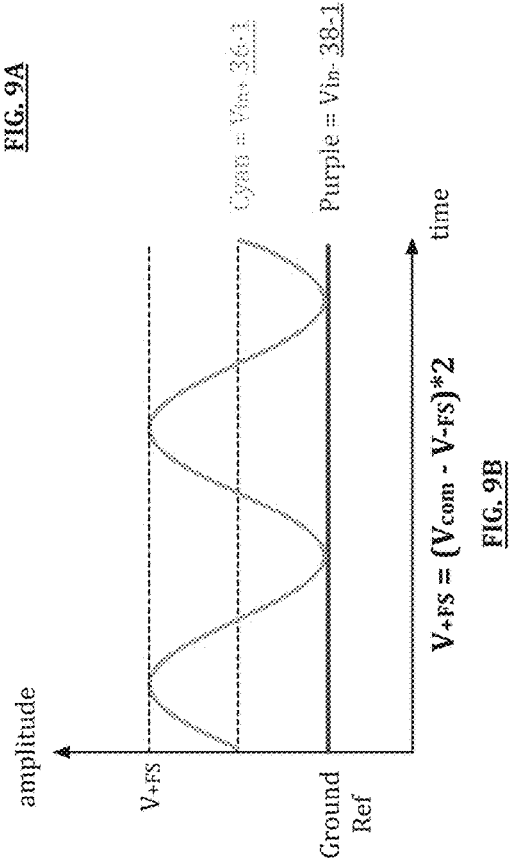
FIG. 9B is a graph illustrating an embodiment of pseudo differential stage clock signals.

FIG. 9B is a graph illustrating an embodiment of pseudo differential clock signals $V_{in+}$ 36-1, shown in Cyan, and $V_{in-}$ 38-1 shown in Purple. $V_{in+}$ 36-1 swings between an effective full scale voltage ($V_{+FS}$) and a ground reference. The effective full scale voltage $V_{+FS}$ is given by the equation: $V_{+FS}=(V_{com}-(V_{-FS}))*2$, where $V_{com}$ is a common voltage, and $V_{-FS}$ is a negative full scale voltage of the DTS pipeline ADC 16. As illustrated, $V_{in-}$ 38-1 is at the ground reference. As such, $V_{in+}$ 36-1 is always positive with respect to $V_{in-}$ 38-1.

FIG. 10A is a schematic block diagram of an embodiment of the pseudo differential input sample and hold (S&H) circuit 70 of FIG. 9 that includes a plurality of switches, an electrostatic shield 45-7, a plurality of capacitors (C1-C3), and an operational amplifier (op amp) 74. A first capacitor C1 is a sampling capacitor that positioned between the positive differential signal $V_{in+}$ and the negative differential signal $V_{in-}$ terminals such that when switches operating with a phase 1 clock signal 36-a1 close, the sampling capacitor is coupled to the $V_{in+}$ 36-1 signal via a first terminal and is coupled to the $V_{in-}$ 38-1 signal via a second terminal. A second capacitor C2 is a charge subtraction capacitor and a third capacitor (C3) is an operational amplifier feedback capacitor, that also functions as a charge transfer capacitor.

In an example of operation, the first capacitor (C1) samples the input pseudo analog differential signal ($V_{in+}$ 36-1 and $V_{in-}$ 38-1) during a first time period (e.g., when switches operating in accordance with a phase 1 clock 36-a1 of FIG. 10B are closed (e.g., ph1 signal is high)). Also during the first time period, a second capacitor (C2) is charged on a first side (e.g., positive terminal) with respect to a negative full scale voltage ($V_{-FS}$) 39 and on a second side (e.g., negative terminal) with respect to the common voltage ($V_{com}$) 37, and an electrostatic shield 45-7 is connected to the $V_{in-}$ 38-1 terminal.

After the first time period, the switches operating in accordance with phase 1 clock signal (ph1 36-a1) open and the sampled pseudo differential signal is held on C1, and a voltage (e.g., $V_{-FS}$ minus $V_{com}$) is held on C2. Next, during the second time period, switches operating in accordance with the phase 2 (ph2) 36-a2 clock close, which causes the first terminal of the first capacitor to be connected to $V_{com}$ 37, the second terminal of the first capacitor to be connected to a line common to the negative terminal of the second capacitor C2 and a first input of the operational amplifier 74, and the positive terminal of the second capacitor C2 to be connected to $V_{com}$ 37.

Due to how the second capacitor C2 is charged, the second capacitor C2 functions to subtract a second charge from the charge held on the first capacitor C1 as a result of sampling the pseudo differential signal. The second charge is given by the equation $Q=C*(V_{-FS}-V_{com})$, where Q is the second charge, C is the capacitance of the second capacitor C2, $V_{-FS}$ is the negative full scale voltage, and $V_{com}$ is the common mode voltage. As such, the full scale voltage range of the pseudo differential input S&H circuit 70 is given by the equation: $V_{+FS}=2*(V_{com}-(V_{-FS}))$. Continuing with the example during the second time period, the operational amplifier 74 produces a voltage output $V_{in-}$ 47-1 based on a difference between the subtracted sampled pseudo differential signal on a first input of the op amp 74 and the common voltage 37 signal on a second input of the op amp 74.

Further during the second time period, the electrostatic shield 45-7 that is positioned proximal to the first capacitor C1 is connected to a common voltage ($V_{com}$) 37. By switching the voltage of the electrostatic shield, the effects of stray parasitic capacitances are shielded from the first capacitor as discussed previously (e.g., unwanted signals couple to the shield 45-7 and low impedance sources and not capacitor C1). In an embodiment, a second electrostatic shield (not illustrated) is also proximal to the second capacitor C2 and connected to $V_{com}$ to prevent unwanted signals from coupling to the second capacitor C2.

FIG. 10B is a graph illustrating clock signals 36-a1 through 36-a5 for a pseudo differential stage of the DTS pipeline analog to digital converter (ADC) 16. As illustrated, phase 1 36-a1 and phase 2 36-a2 signals are non-overlapping, while the phase 3 36-3 and strobe 36-a5 signals do overlap. The pseudo differential stage 70 utilizes the clock signals such that the pseudo differential analog input signal is able to be accurately sampled, transferred to a next stage, and converted to a digital representation at the pseudo differential stage.

Figure 11A:
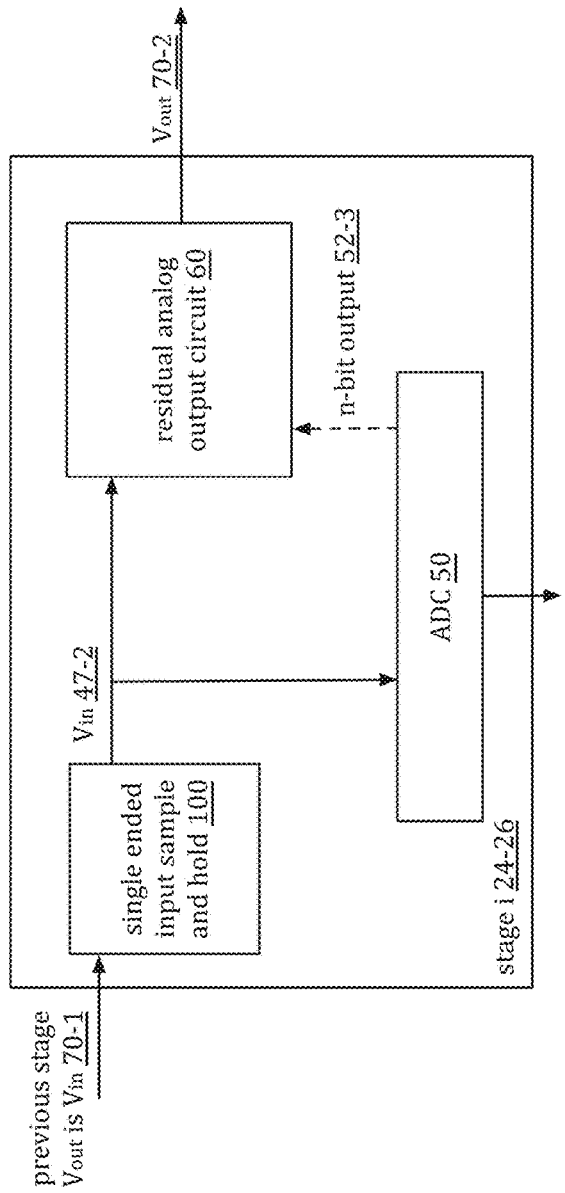
FIG. 11A is a schematic block diagram of an embodiment of a stage "i" of the pipeline ADC.

FIG. 11A is a schematic block diagram of an embodiment of an intermediate stage "i" 24-26 of the DTS pipeline analog to digital converter (ADC) 16, where "i" is an integer from 2 to k–1. The stage 24-26 includes a single ended input sample and hold (S&H) circuit 100, a residual analog output circuit 60, and an analog to digital converter (ADC) 50. The intermediate stage 24-26 functions to produce an n-bit digital output 52-2 and a residual analog voltage signal Vo t 70-2 based on a previous stages' output voltage $V_{out}$ (e.g., $V_{in}$ 70-1).

In an example of operation, the single ended input S&H 100 receives a previous stages' residual analog output $V_{out}$ 70-1 as an input voltage signal ($V_{in\_}$ 70-1). The single ended S&H circuit 100 produces $V_{in}$ 47-2 based on sampling the previous stages' residual signal output signal ($V_{in}$ 70-1). The $V_{in}$ 47-2 signal is output to ADC 50 and a residual analog output circuit 60. The ADC 50 generates an n-bit output 52-2 based on the $V_{in}$ 47-2 signal and a common voltage. Residual analog output circuit 60 produces Vout 70-2, which is a representation (e.g., gained, DC shifted, etc.) of one or more of the $V_{in}$ 47-2 signal and a fed back n-bit output 52-3. $V_{out}$ 70-2 is then output to a next stage in the DTS pipeline ADC 16.

Figure 11B:
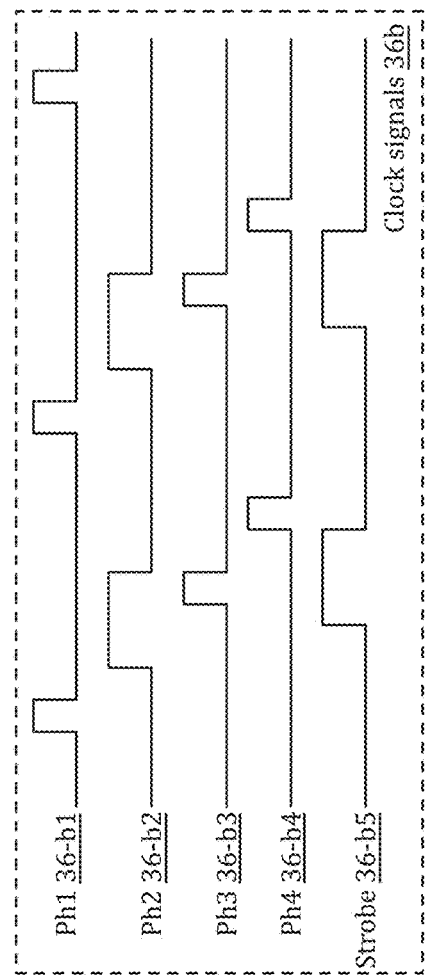
FIG. 11B is a graph illustrating an embodiment of a single ended stage clock signals

FIG. 11B is a graph illustrating clock signals 36-b1 through 36-b5 for a single ended stage (e.g., stage i 24-26) of the DTS pipeline ADC 16. As illustrated, phase 1 36-b1 and phase 2 36-b2 signals are non-overlapping, while the phase 2 36-2 and phase 3 36-3 signals do overlap and have their respective falling edges aligned. The single ended stage utilizes the clock signals 36b such that the analog input signal is able to be accurately sampled, transferred to a next stage (when the instant stage is not the final stage), and converted to a digital representation at the instant stage (e.g., the single ended stage). In an example, the clock signals 36b-3 and 36-b4 may be omitted when the single ended stage is the final stage.

Figure 12A:
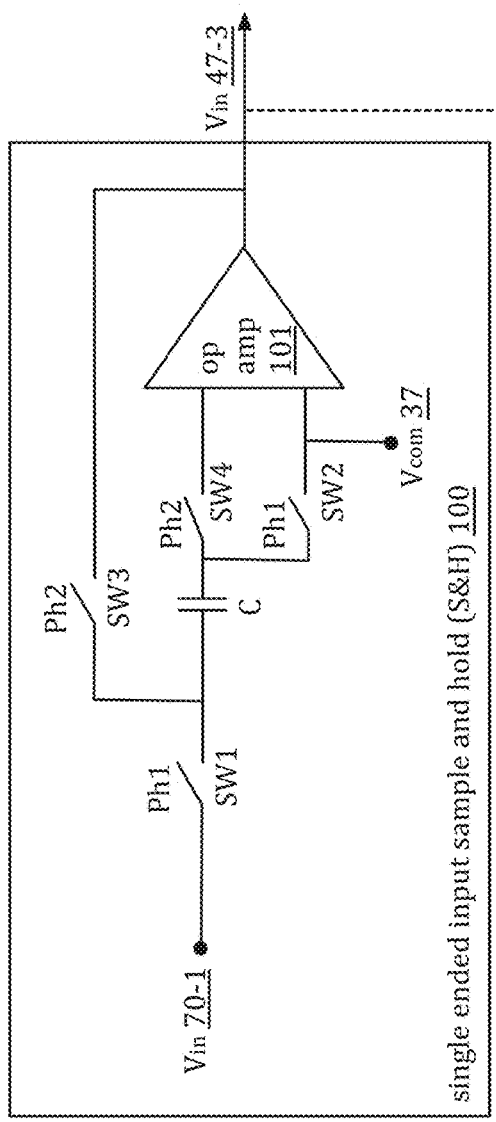
FIG. 12A is a schematic block diagram of an embodiment of a single ended input sample and hold (S&H) circuit.

FIG. 12A is a schematic block diagram of an embodiment of a single ended input sample and hold (S&H) circuit 100 that includes a plurality of switches (SW1-4), a capacitor (C) and an operational amplifier (op amp) 101. The single ended input S&H circuit 100 operates to produce an analog output signal ($V_{in}$) 47-3 representative of a comparison of a residual analog signal ($V_{in}$) 70-1 received from a previous stage and a common voltage $V_{com}$ 37.

In an example of operation, when the phase 1 clock 36-b1 is high, switches 1 and 2 close and the capacitor samples residual analog signal $V_{in}$ 70-1 with respect to a common voltage ($V_c$om) 37. Phase 1 clock then goes low and the capacitor holds the sampled charge until phase 2 clock 36-b2 goes high, and switches 3 and 4 close. The op amp 101 produces $V_{in}$ 47-3 based on a comparison of the $V_{com}$ 37 voltage signal on a first input of op amp 101 and the sampled charge (e.g., the voltage across C) on a second input of op amp 101. The $V_{in}$ 47-3 is output to a residual analog output circuit (e.g., while phase clocks 36-b2 and 36-b3 are high) and to an analog to digital converter (ADC) circuit 50 of the stage.

Figure 12B:
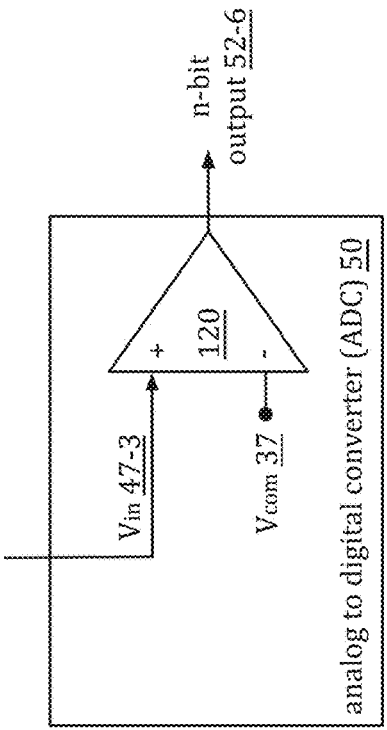
FIG. 12B is a schematic block diagram of an embodiment of an analog to digital converter (ADC) circuit.

FIG. 12B is a schematic block diagram of an embodiment of an analog to digital converter (ADC) circuit 50 that includes a comparator 120. The ADC produces an n-bit output 52-6 based on comparing a common voltage 37 to a voltage signal 47-x received from a sample and hold circuit (e.g., S&H 40, S&H 70, S&H 100). As an example, when $V_{in}$ 47-x is above a first threshold voltage (e.g., $V_{com}$), and "n", the number of bits is 1, the ADC produces a digital "1" as the output 52-6. When $V_{in}$ 47-x is below the first threshold voltage, and "n", the number of bits is 1, the ADC produces a digital "0" as the output 52-6.

Figure 13:
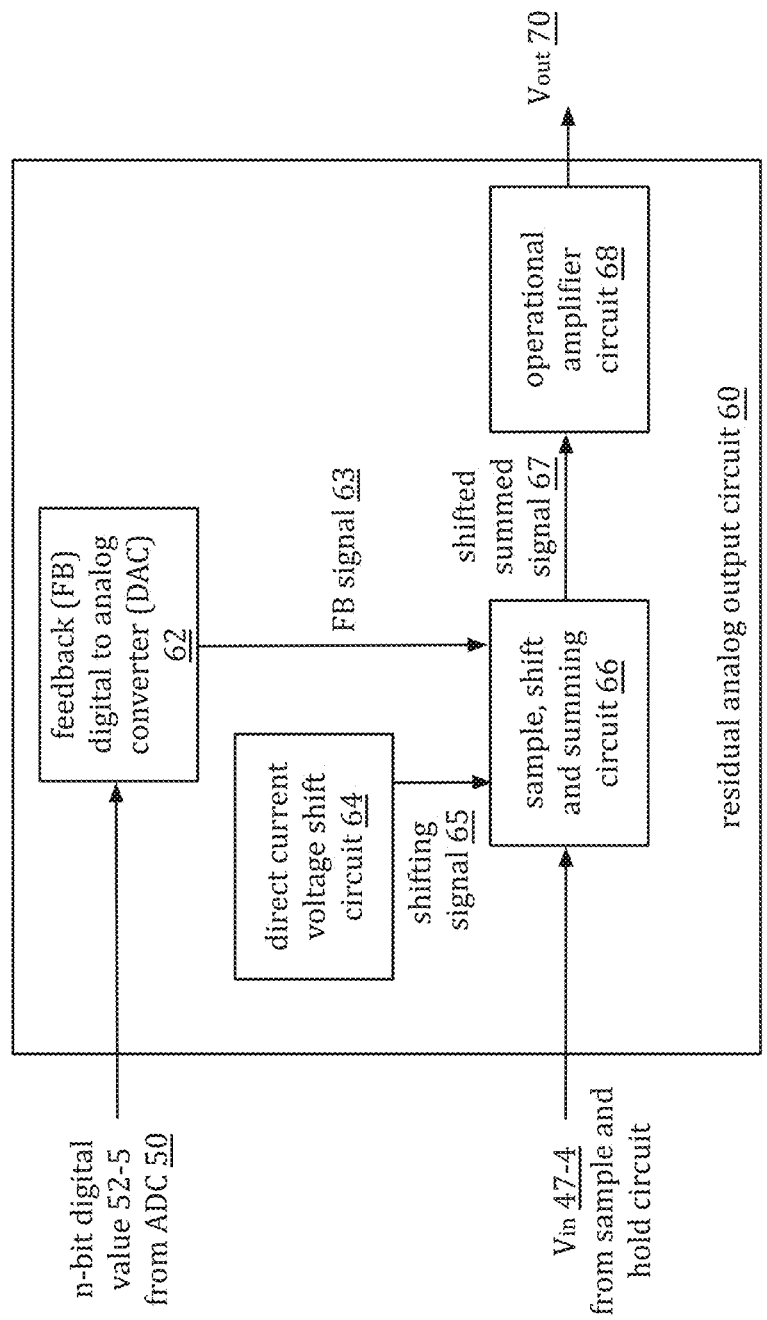
FIG. 13 is a schematic block diagram of an embodiment of a residual analog output circuit.

FIG. 13 is a schematic block diagram of an embodiment of a residual analog output circuit 60 that includes a feedback digital to analog converter (DAC) 62, a direct current (DC) voltage shift circuit 64, a sample, shift, & summing circuit 66, and an operational amplifier circuit 68. In general, the residual analog output circuit 60 produces a gained, summed and/or direct current (DC) voltage shifted representation ($V_{out}$ 70) of one or more of the $V_{in}$ 47-4 signal and the fed back representation of an n-bit digital value 52-5.

In an example of operation, the feedback DAC 52 converts a digital value 52-5 from an ADC 50 of a stage to an analog feedback (FB) signal 63. For example, when the digital value is a 1-bit "0", the feedback DAC produces no output as the FB signal 63, and when the digital value is a 1-bit "1", the feedback DAC produces a feedback (FB) signal having a first voltage level. The direct current shift circuit 64 generates a direct current (DC) shifting signal 65 to shift a sampled $V_{in}$ 47-4 signal.

The sample, shift and summing circuit 66 samples the $V_{in}$ 47-4 signal, shifts the $V_{in}$ 47-4 signal, and sums (e.g., combines, adds, subtracts, etc.) the sampled $V_{in}$ 47-4 signal with the DC shifting signal 65 and the FB signal 63 to produce a shifted summed signal 67, which is output on a line coupled to a first input (e.g., the inverting input) of the operational amplifier circuit 68. The op amp 68 produces residual voltage $V_{out}$ 70 based comparing the shifted summed signal 67 on the first input to a common voltage signal on a second input.

Figure 14:
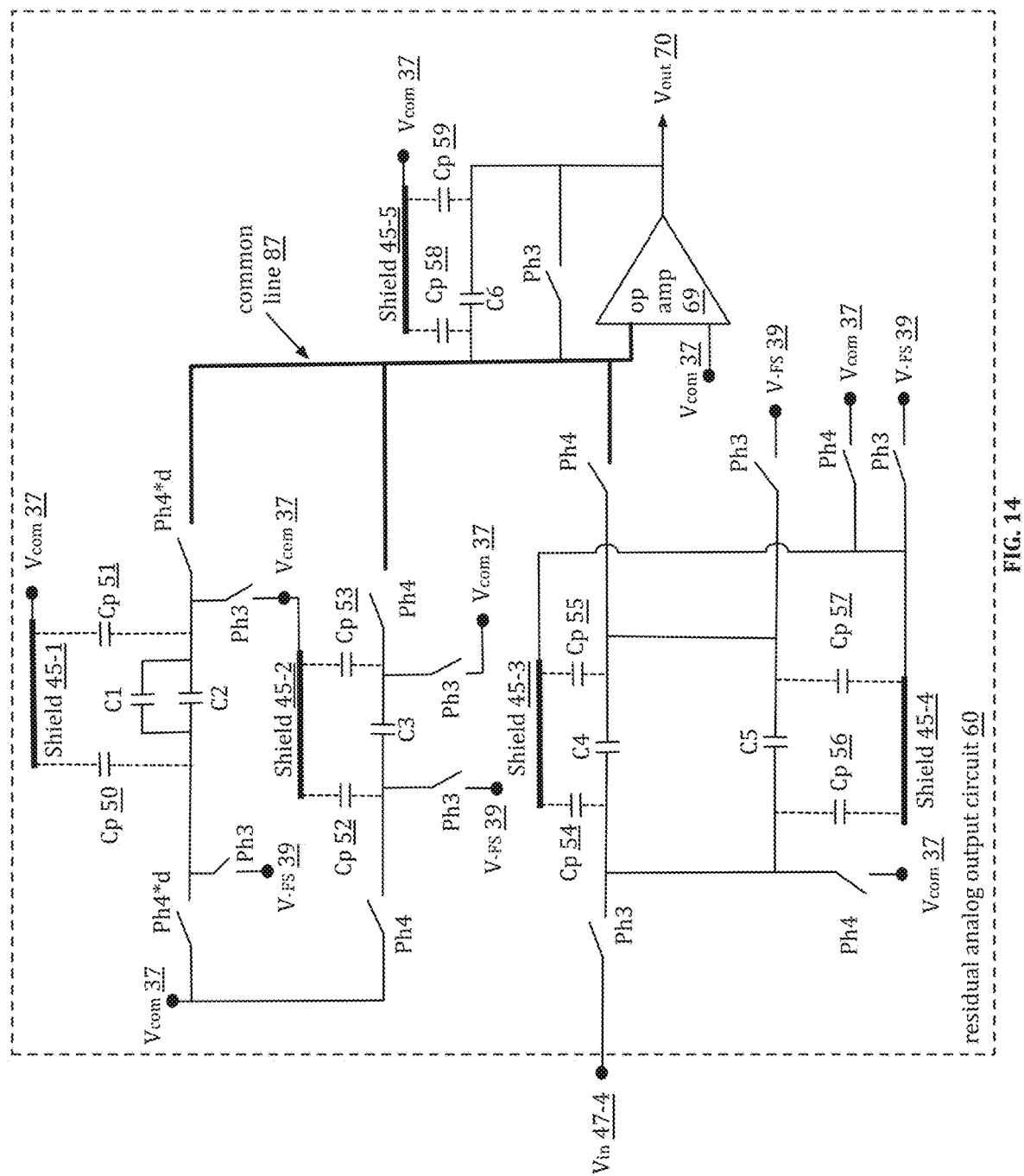
FIG. 14 is a schematic block diagram of another embodiment of a residual analog output circuit.

FIG. 14 is a schematic block diagram of another embodiment of the residual analog output circuit 60 which includes an electrostatic shield 45-1 that is proximal to a first and second capacitor C1 and C2, an electrostatic shield 45-2 that is proximal to a third capacitor C3, an electrostatic shield 45-3 that is proximal to a fourth capacitor C4, an electrostatic shield 45-4 that is proximal to a fifth capacitor C5, and an electrostatic shield 45-5 that is proximal to a sixth capacitor C6. Electrostatic Shields 45-1, 45-2, and 45-5, when operable, are connected to a common voltage ($V_{com}$) 37, while electrostatic shields 45-3 and 45-4, when operable, are switched between a negative full scale voltage ($V_{-FS}$) 39 and a common voltage $V_{com}$ 37.

In an example, unwanted signals can capacitively couple to one or more of the capacitors. This unwanted signal capacitive coupling can be electrically modeled as parasitic capacitors (e.g., Cp 50-59). By connecting the electrostatic shields with the particular voltages illustrated, the effects of the parasitic capacitors 50-59 on the signal chain are minimized, which allows the residual analog circuit 60 to produce $V_{out}$ 70 with substantially no signal loss or loss of the dynamic range of the input signal $V_{in}$ 47-4.

Note that in an embodiment, capacitors in parallel may be implemented by a single capacitor. For example, when C1 and C2 have the same capacitance, a capacitor C1-1 having twice the individual capacitance of C1 or C2 may replace capacitors C1 and C2. Further note that in certain embodiments there may be more capacitors. For example, when C1 and C2 have substantially the same capacitance and produce a gain of 2, another two capacitors having the capacitance of C1 may be added in parallel with C1 and C2 for a gain of 4. Still further note that the first and second capacitors C1 and C2 may each have their own respective electrostatic shield 45. In an example, each of the capacitors C1-C6 have substantially the same capacitance. In another example, the operational amplifier 69 has an open loop gain such that the common line 87 has approximately the same voltage value as the common voltage $V_{com}$ 37.

In an example of operation, during a third time period (e.g., when ph3 clock signals 36 of the stage are high), the $V_{in}$ 47-4 input, that is output from a sample and hold circuit (e.g., S&H 40, S&H 70, S&H 100), is sampled onto capacitors C4 and C5, which are referenced (e.g., on a negative terminal of the capacitor) to a negative full scale voltage ($V_{-FS}$) 39. The electrostatic shields 45-3 and 45-4 are each connected to the negative full scale voltage ($V_{-FS}$) 39. As such, during the third time period, the voltage difference between the negative terminal of the capacitor C4 and shield 45-3 and the voltage difference between the negative terminal of capacitor C5 and shield 45-4 is substantially zero volts (e.g., 0V, less than a threshold difference (e.g., 1%), etc.). This results in parasitic capacitances 55 and 57 having no charge, and parasitic capacitances 54 and 56 having a first charge based on the $V_{in}$ 47-4 signal and the negative full scale voltage ($V_{-FS}$) 39 and the respective capacitive value of the parasitic capacitors.

Further during the third time period, capacitors C1, C2 and C3 are charged with respect to a negative full scale voltage ($V_{-FS}$) on a positive terminal and with respect to a common voltage ($V_{com}$) 37 on a negative terminal. In an example, C1 and C2 are only charged when "d" equals 1). Electrostatic shields 45-1 and 45-2 are both connected to a $V_{com}$ 37 terminal, including during the third time period. As such, during the third time period, the voltage difference between the negative terminal of the capacitors C1 and C2 and shield 45-1 and the voltage difference between the negative terminal of capacitor C3 and shield 45-2 is substantially zero volts (e.g., 0V, less than 0.001V, etc.). This results in parasitic capacitances 51 and 53 having substantially no charge, and parasitic capacitances 50 and 52 having a second charge based a difference between the negative full scale voltage ($V_{-FS}$) 39 and the common voltage ($V_{com}$) 37 and the respective capacitive value of the parasitic capacitors 50 and 52.

During the fourth time period, sampling capacitors C4 and C5 are switched such that their positive terminals are connected to $V_{com}$ 37 and their negative terminals are connected to a line common (common line 87) to a first input of the operational amplifier 69 and an output of capacitors C1 and C2 (e.g., feedback DAC) and an output of capacitor C3 (e.g., DC voltage shift circuit). Also during the fourth time period, the electrostatic shields 45-3 and 45-4 are switched from the negative full scale voltage $V_{-FS}$ 39 to the common voltage $V_{com}$ 37. As such, the first charge on parasitic capacitances 54 and 56 does not change and therefore does not affect the sampled $V_{in}$ 47-4 signal on capacitors C4 and C5.

Further during the fourth period, capacitor C3 is switched to $V_{com}$ on the positive terminal and the common line 87 on the negative terminal. When the output of the ADC 50 (e.g., d) is "1", the first and second capacitors C1 and C2 are switched to $V_{com}$ on their positive terminals and the common line 87 on their negative terminals. For parasitic capacitances 50 and 52 having the second charge, their charge does not change and therefore does not affect the charge on capacitors C1, C2 and C3, respectively. Due to parasitic capacitances 51 and 53 having no charge, they do not affect the summing signals. Thus, the electrostatic shields 45-1 and 45-2 increase the quality of charge transfer for capacitors C1, C2 and C3.

Having the output of capacitors 1-5 (C1-C5) output to the common line 87 results in the charge (e.g., q=CV, where C is the capacitance of the capacitor, and V is the voltage across the capacitor) from capacitors C1-C5 being summed (e.g., (q1+q2+q3+q4+q5)) and received by operational amplifier (op amp) 69. Note there will be no charge (q1 or q2) from the first and second capacitors C1 and C2, when the output "d" of the ADC of the stage is a digital zero. Due to the orientation of charge on capacitors, the charge from capacitors C1, C2, and C3 will subtract from the charge on capacitors C4 and C5 and the total charge from capacitors C1-C5 is added to capacitor C6. For example, the equation for the summed charge on capacitor C6 is equal to charge total of q6=(q4+q5)−(q1+q2+q3). Operational amplifier 69 generates Vout 70 to keep the common line input voltage equal to the common mode voltage $V_{com}$ 37 via feedback capacitor C6. The electrostatic shield 45-5 is connected to $V_{com}$ 37 and operates similarly to electrostatic shields 45-1 and 45-2 to minimize parasitic capacitances 54 and 55 from effecting the signal chain.

The following is an example of operation of the residual analog output circuit 60 in the charge domain (q) in accordance with the theory of conservation of charge. The theory states that the charge "q" that is stored on capacitors C1-C6 during a third time period (e.g., when a Ph3 36 clock is high) is equal to the charge stored on capacitors C1-C6 during a fourth time period (e.g., when a Ph4 36 clock is high). Note as shown in FIG. 14, the Ph4 switches operable to connected capacitors C1 and C2 to the common voltage 37 and the common line 87 are multiplied by "d", which is the output of the ADC of the stage. As such, the charges Q1 and Q2 are multiplied by d. This results that the charge on C1 (Q1) and C2 (Q2) is transferred to C6 during a fourth time period (e.g., when Ph4 switches are closed) when d=1. Further note that the charge is in accordance with the equation Q=C*V, where Q is the charge on a capacitor, C is the capacitance of the capacitor, and V is the voltage across the capacitor.

In this example, the total charge (Qtotal_ph3) during the third time period is given as:

$$Q\text{total\_ph3}=Q1+Q2+Q3+Q4+Q5+Q6.$$

$Q1=(V_{-FS}-V_{com})*C1*d$, where d=1 or 0 depending upon the output of 1-bit ADC 50 of FIG. 12B.

$Q2=(V_{-FS}-V_{com})*C2*d$, where d=1 or 0 depending upon the output of 1-bit ADC 50 of FIG. 12B.

$$Q3=(V_{-FS}-V_{com})*C3$$

$$Q4=(V_{in\ 47\text{-}4}-V_{-FS})*C4$$

$$Q5=(V_{in\ 47\text{-}4}-V_{-FS})*C5$$

Q6=0 due to C6 being shorted out by Ph3 switch from output of op amp 69 to input on common line 87.

Thus, the total charge during the third time period may also be expressed as:

$$Q\text{total\_ph3} = [(V_{-FS} - V_{com}) * C1 * d] + [(V_{-FS} - V_{com}) * C2 * d] + [(V_{-FS} - V_{com}) * C3] + [(Vin_{47-4} - V_{-FS}) * C4] + [(Vin_{47-4} - V_{-FS}) * C5]$$

During the fourth time period, the total charge (Qtotal_ph4) is given as:

$$Q1 = (V_{com} - V_{line\_87}) * C1 = 0$$

$$Q2 = (V_{com} - V_{line\_87}) * C2 = 0$$

$$Q3 = (V_{com} - V_{line\_87}) * C3 = 0$$

$$Q4 = (V_{com} - V_{line\_87}) * C4 = 0$$

$$Q5 = (V_{com} - V_{line\_87}) * C5 = 0$$

$$Q6 = (V_{out} - V_{line\_87}) * C6$$

$$Q\text{total\_ph4} = Q1 + Q2 + Q3 + Q4 + Q5 + Q6$$

$$Q\text{total\_ph4} = (V_{out} - V_{line\_87}) * C6$$

Due to the charge conservation principle, the charge during the fourth time period is equal to the charge during the third time period, which can be expressed as:

$$Q\text{total\_ph4} = Q\text{total\_ph3}$$

As such: $(V_{out} - V_{line\_87}) * C6 = [(V_{-FS} - V_{com}) * C1 * d] + [(V_{-FS} - V_{com}) * C2 * d] + [(V_{-FS} - V_{com}) * C3] + [(Vin_{47-4} - V_{-FS}) * C4] + [(Vin_{47-4} - V_{-FS}) * C5]$ When setting the capacitances equal to each other (C1=C2=C3=C4=C5=C6), this yields the equation:

$$(V_{out} - V_{line\_87}) * C = [(V_{-FS} - V_{com}) * C * d] + [(V_{-FS} - V_{com}) * C * d] + [(V_{-FS} - V_{com}) * C] + [(Vin_{47-4} - V_{-FS}) * C] + [(Vin_{47-4} - V_{-FS}) * C]$$

Dividing both sides of equation by C yields the equation:

$$(V_{out} - V_{line\_87}) = [(V_{-fs} - V_{com}) * d] + [(V_{-FS} - V_{com}) * d] + (V_{-FS} - V_{com}) + (V_{in\ 47-4} - V_{-fs}) + (Vin_{47-4} - V_{-FS})$$

When setting the inputs of the op amp 69 equal to each other, given as $V_{line\_87} = V_{com}$, this yields the equation:

$$(V_{out} - V_{com}) = [(V_{-FS} - V_{com}) * d] + [(V_{-FS} - V_{com}) * d] + (V_{-FS} - V_{com}) + (V_{in\ 47-4} - V_{-fs}) + (Vin_{47-4} - V_{-FS})$$

Solving for $V_{out}$ yields the equation:

$$V_{out} = [(V_{-FS} - V_{com}) * d] + [(V_{-FS} - V_{com}) * d] + (V_{-FS} - V_{com}) + (V_{in\ 47-4} - V_{-FS}) + (Vin_{47-4} - V_{-FS}) + V_{com}$$

When setting $V_{com} = 0.5$ v and $V_{-FS} = 0$ v, this yields the equation:

$$V_{out} = [(0 - 0.5) * d] + [(0 - 0.5) * d] + (0 - 0.5) + (Vin_{47-4} - 0) + (Vin_{47-4} - 0) + 0.5$$

Simplifying the equation gives: $V_{out} = [2*(-0.5)*d] + [2*V_{in\ 47-4}]$

Further simplifying the equation leads to the final output voltage equation:

$$V_{out} = 2 * [V_{in\ 47-4} - (0.5 * d)]$$

Thus, when $Vin_{47-4} \leq V_{com}$, then the output "d" of the ADC is: d=0, and thus $V_{out}$ 70 is given as: $V_{out} = 2*[Vin_{47-4}]$ When $Vin_{47-4} > V_{com}$, then the output "d" of the ADC is: d=1, and thus $V_{out}$ 70 is given as: $V_{out} = 2*[Vin_{47-4} - 0.5]$.

In an example, this operation of the residual analog output circuit prevents the sampled signal from drifting to the negative $V_{-FS}$ voltage.

Figure 15:
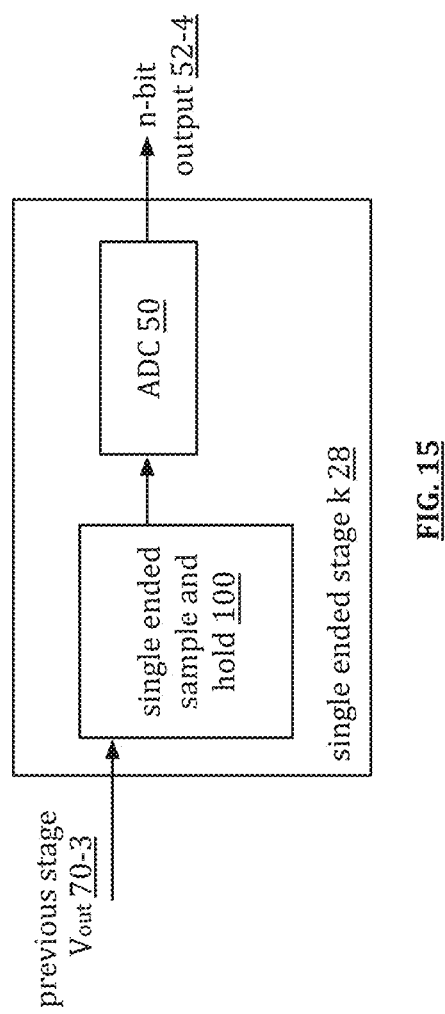
FIG. 15 is a schematic block diagram of an embodiment of a final stage of the pipeline ADC.

FIG. 15 is a schematic block diagram of an embodiment of a final stage k 28 of the DTS pipeline ADC 16. The final stage 28 includes a single ended sample and hold circuit 100 and an analog to digital converter (ADC) 50. The single ended final stage 28 does not need to include a residual analog output circuit 60 as included in previous stages due to the ADC 50 outputting the least significant bit (LSB). As such, a residual analog signal is no longer needed.

Figure 16:
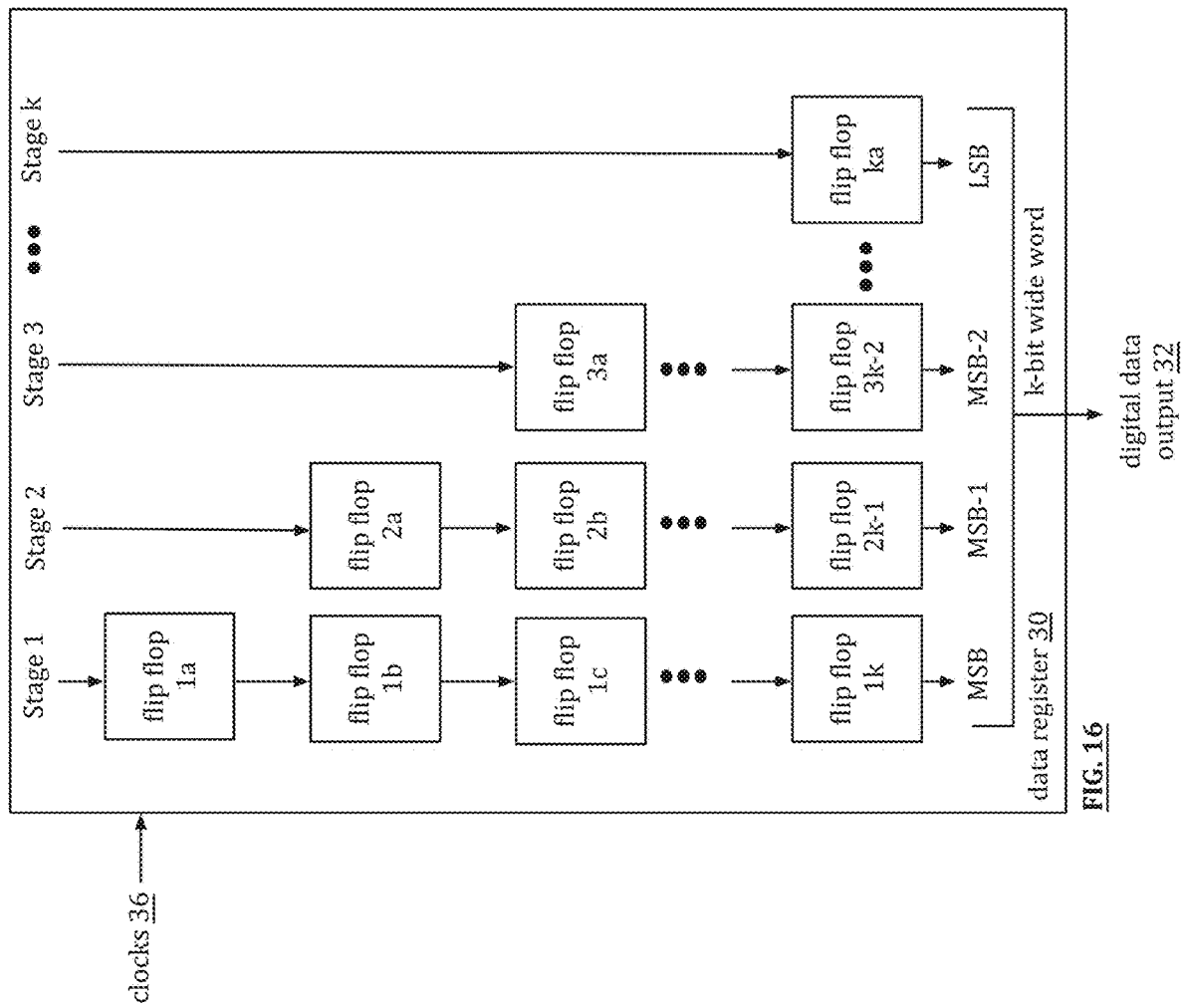
FIG. 16 is a schematic block diagram of an embodiment of an output register of the pipeline ADC.

FIG. 16 is a schematic block diagram of an embodiment of a data register 30 of the DTS pipeline ADC 16. The data register 30 includes a plurality of flip flops 1a-ka that are arranged in a cascaded structure to align and produce a k-bit data word after k clock cycles. The clocking of the data register is synchronized with the output of each stage of stages 1-k such that after k clock 36 cycles, a k-bit data word is produced as digital data output 32, which represents the analog input 20 of the pipeline ADC 16. After the first k clock cycle delay, a next clock cycle produces a second k-bit data word due to the pipelined structure of the DTS pipeline ADC. Note the flip flop may be implemented one or more of a D flip flop, a T flip flop, an SR flip flop, and a JK flip flop.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., indicates an advantageous relationship that would be evident to one skilled in the art in light of the present disclosure, and based, for example, on the nature of the signals/items that are being compared. As may be used herein, the term "compares unfavorably", indicates that a comparison between two or more items, signals, etc., fails to provide such an advantageous relationship and/or that provides a disadvantageous relationship. Such an item/signal can correspond to one or more numeric values, one or more measurements, one or more counts and/or proportions, one or more types of data, and/or other information with attributes that can be compared to a threshold, to each other and/or to attributes of other information to determine whether a favorable or unfavorable comparison exists. Examples of such an advantageous relationship can include: one item/signal being greater than (or greater than or equal to) a threshold value, one item/signal being less than (or less than or equal to) a threshold value, one item/signal being greater than (or greater than or equal to) another item/signal, one item/signal being less than (or less than or equal to) another item/signal, one item/signal matching another item/signal, one item/signal substantially matching another item/signal within a predefined or industry accepted tolerance such as 1%, 5%, 10% or some other margin, etc. Furthermore, one skilled in the art will recognize that such a comparison between two items/signals can be performed in different ways. For example, when the advantageous relationship is that signal 1 has a greater magnitude than signal 2, a favorable comparison may be achieved when the magnitude of signal 1 is greater than that of signal 2 or when the magnitude of signal 2 is less than that of signal 1. Similarly, one skilled in the art will recognize that the comparison of the inverse or opposite of items/signals and/or other forms of mathematical or logical equivalence can likewise be used in an equivalent fashion. For example, the comparison to determine if a signal X>5 is equivalent to determining if −X<−5, and the comparison to determine if signal A matches signal B can likewise be performed by determining −A matches −B or not(A) matches not(B). As may be discussed herein, the determination that a particular relationship is present (either favorable or unfavorable) can be utilized to automatically trigger a particular action. Unless expressly stated to the contrary, the absence of that particular condition may be assumed to imply that the particular action will not automatically be triggered. In other examples, the determination that a particular relationship is present (either favorable or unfavorable) can be utilized as a basis or consideration to determine whether to perform one or more actions. Note that such a basis or consideration can be considered alone or in combination with one or more other bases or considerations to determine whether to perform the one or more actions. In one example where multiple bases or considerations are used to determine whether to perform one or more actions, the respective bases or considerations are given equal weight in such determination. In another example where multiple bases or considerations are used to determine whether to perform one or more actions, the respective bases or considerations are given unequal weight in such determination.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, a quantum register or other quantum memory and/or any other device that stores data in a non-transitory manner. Furthermore, the memory device may be in a form of a solid-state memory, a hard drive memory or other disk storage, cloud memory, thumb drive, server memory, computing device memory, and/or other non-transitory medium for storing data. The storage of data includes temporary storage (i.e., data is lost when power is removed from the memory element) and/or persistent storage (i.e., data is retained when power is removed from the memory element). As used herein, a transitory medium shall mean one or more of: (a) a wired or wireless medium for the transportation of data as a signal from one computing device to another computing device for temporary storage or persistent storage; (b) a wired or wireless medium for the transportation of data as a signal within a computing device from one element of the computing device to another element of the computing device for temporary storage or persistent storage; (c) a wired or wireless medium for the transportation of data as a signal from one computing device to another computing device for processing the data by the other computing device; and (d) a wired or wireless medium for the transportation of data as a signal within a computing device from one element of the computing device to another element of the computing device for processing the data by the other element of the computing device. As may be used herein, a non-transitory computer readable memory is substantially equivalent to a computer readable memory. A non-transitory computer readable memory can also be referred to as a non-transitory computer readable storage medium.

One or more functions associated with the methods and/or processes described herein can require data to be manipulated in different ways within overlapping time spans. The human mind is not equipped to perform such different data manipulations independently, contemporaneously, in parallel, and/or on a coordinated basis within a reasonable period of time, such as within a second, a millisecond, microsecond, a real-time basis or other high speed required by the machines that generate the data, receive the data, convey the data, store the data and/or use the data.

One or more functions associated with the methods and/or processes described herein can be implemented in a system that is operable to electronically receive digital data via a wired or wireless communication network and/or to electronically transmit digital data via a wired or wireless communication network. Such receiving and transmitting cannot practically be performed by the human mind because the human mind is not equipped to electronically transmit or receive digital data, let alone to transmit and receive digital data via a wired or wireless communication network.

One or more functions associated with the methods and/or processes described herein can be implemented in a system that is operable to electronically store digital data in a memory device. Such storage cannot practically be performed by the human mind because the human mind is not equipped to electronically store digital data.

One or more functions associated with the methods and/or processes described herein may operate to cause an action by a processing module directly in response to a triggering event—without any intervening human interaction between the triggering event and the action. Any such actions may be identified as being performed "automatically", "automatically based on" and/or "automatically in response to" such a triggering event. Furthermore, any such actions identified in such a fashion specifically preclude the operation of human activity with respect to these actions—even if the triggering event itself may be causally connected to a human activity of some kind.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A pipeline analog to digital converter (ADC) comprising:
    a first stage of a "k" number of stages, wherein the first stage is configured to receive an analog differential input signal and produce a first digital output and a first single ended analog output, and wherein the first stage includes a differential input sample and hold circuit comprising:
        a switched capacitor configured to sample, during a first time period, the analog differential input signal to produce a sampled analog differential input signal; and
        an operational amplifier configured to, during a second time period, generate a single ended voltage signal based on a voltage difference between the sampled analog differential input signal and a common voltage, wherein the single ended voltage signal is output on a single ended output line of the operational amplifier;
    a second stage of the "k" number of stages is configured to receive the first single ended analog output and produce a second digital output; and
    an output data register that is configured to generate an output digital value based on the first and second digital outputs.

2. The pipeline ADC of claim 1, wherein when the "k" number of stages includes a third stage, the second stage is further configured to produce a second single ended analog output.

3. The pipeline ADC of claim 1, wherein the first stage further comprises:
    an analog to digital converter (ADC).

4. The pipeline ADC of claim 3, wherein the the first stage further comprises:
    a residual analog output circuit.

5. The pipeline ADC of claim 4, wherein the residual analog output circuit comprises:
    a feedback digital to analog converter (DAC) operable to:
        generate a feedback signal based on an "n" bit digital output received from the ADC;
    a direct current (DC) voltage shift circuit operable to:
        generate a DC voltage shifting signal;
    a summing circuit operable to:
        receive the single ended voltage signal;
        sum the received single ended voltage signal with the DC voltage shifting signal and the feedback signal to produce a summed signal; and
    an operational amplifier circuit operable to:
        generate the first single ended analog output based on a comparison of the summed signal and the common voltage.

6. The pipeline ADC of claim 5, wherein the feedback DAC comprises:
    a plurality of switches;
    a first capacitor;
    a second capacitor;
    a first electrostatic shield proximal to the first capacitor and coupled to the common voltage; and
    a second electrostatic shield proximal to the second capacitor and coupled to the common voltage.

7. The pipeline ADC of claim 5, wherein the DC shift circuit comprises:
    a plurality of switches;
    a capacitor; and
    an electrostatic shield proximal to the capacitor and coupled to the common voltage.

8. The pipeline ADC of claim 3, wherein the analog to digital converter comprises:
    a comparator that is configured to:
        receive the single ended voltage signal from the differential input sample and hold circuit; and
        produce an "n" bit digital output based on comparing the single ended voltage signal to the common voltage.

9. The pipeline ADC of claim 8, wherein a value of "n" comprises one or more of:
    one bit;
    one and a half bits; and
    two or more bits.

10. The pipeline ADC of claim 5, wherein the summing circuit comprises:
    a plurality of switches;
    a first capacitor;
    a second capacitor;
    a first switched electrostatic shield proximal to the first capacitor; and
    a second switched electrostatic shield proximal to the second capacitor, wherein during a third time period, the first and second electrostatic shields are coupled to a negative full scale voltage, and wherein during a fourth time period the first and second electrostatic shields are coupled to the common voltage.

11. The pipeline ADC of claim 5, wherein the operational amplifier circuit comprises:
    a first input;
    a second input;
    an output;
    a first feedback path between the output the first input, wherein the first feedback path includes a switch that is configured to close during a third time period; and
    a second feedback path between the output the first input, wherein the second feedback path includes a feedback capacitor.

12. The pipeline ADC of claim 1, wherein the differential input sample and hold circuit further comprises:
    an electrostatic shield proximal to the switched capacitor, and coupled via a first switch to a negative terminal of the analog differential input signal and via a second switch to the common voltage.

13. The pipeline ADC of claim 12, wherein during the first time period, the first switch closes coupling the electrostatic shield to the negative terminal of the analog differential input signal, and wherein during the second time period, the first switch is open and the second switch closes coupling the electrostatic shield to the common voltage.

14. The pipeline ADC of claim 13, wherein during the first time period, a minus signal terminal of the switched capacitor has a first voltage and the electrostatic shield has a second voltage, and wherein the first voltage is substantially the same as the second voltage.

15. The pipeline ADC of claim 1, wherein the second stage comprises:
   a single ended input sample and hold circuit; and
   a second ADC.

16. The pipeline ADC of claim 15, wherein when the second stage is not a final stage of the "k" number of stages, the second stage further comprises:
   a second residual analog output circuit.

17. The pipeline ADC of claim 15, wherein the single ended input sample and hold circuit comprises:
   a capacitor operable to sample, during a fifth time period, the first single ended analog output to produce a sampled first single ended analog output; and
   an operational amplifier operable to, during a sixth time period, generate a second single ended voltage signal based on a voltage difference between the sampled first single ended analog output and a common voltage, wherein the second single ended voltage signal is output on a single ended output line of the operational amplifier.

18. The pipeline ADC of claim 17, wherein the single ended input sample and hold circuit further comprises:
   an electrostatic shield proximal to the capacitor and coupled to the common voltage.

19. A pipeline analog to digital converter (ADC) comprising:
   a first stage of a "k" number of stages, wherein the first stage is configured to receive an analog differential input signal and produce a first digital output and a first single ended analog output, and wherein the first stage includes a pseudo differential input sample and hold circuit comprising:
      a feedback capacitor;
      a sampling capacitor operable to sample, during a first time period, the analog differential input signal to produce a sampled analog differential input signal;
      a charge subtraction capacitor operable to subtract a charge from the sampled analog differential input signal to produce a subtracted sampled analog differential input signal; and
      an operational amplifier operable to, during a second time period, generate a single ended voltage signal based on a voltage difference between the subtracted sampled analog differential input signal and a common voltage, wherein the single ended voltage signal is output on a single ended output line of the operational amplifier;
   a second stage of the "k" number of stages configured to receive the first single ended analog output and produce a second digital output; and
   an output data register configured to generate an output digital value based on the first digital output.

20. The pipeline ADC of claim 19, wherein the first stage further comprises:
   an analog to digital converter (ADC); and
   a residual analog output circuit.

* * * * *